United States Patent
Trias

(10) Patent No.: US 10,197,606 B2
(45) Date of Patent: Feb. 5, 2019

(54) SYSTEM AND METHOD FOR OBTAINING THE POWERFLOW IN DC GRIDS WITH CONSTANT POWER LOADS AND DEVICES WITH ALGEBRAIC NONLINEARITIES

(71) Applicant: Aplicaciones en Informática Avanzada, S.A, Barcelona (ES)

(72) Inventor: Antonio Trias, Barcelona (ES)

(73) Assignee: Aplicaciones en Informática Avanzada, S.A, Barcelona (ES)

( * ) Notice: Subject to any disclaimer, the term of this patent is extended or adjusted under 35 U.S.C. 154(b) by 129 days.

(21) Appl. No.: 15/176,310

(22) Filed: Jun. 8, 2016

(65) Prior Publication Data

US 2017/0003330 A1  Jan. 5, 2017

Related U.S. Application Data

(60) Provisional application No. 62/187,839, filed on Jul. 2, 2015.

(51) Int. Cl.
G01R 21/133 (2006.01)
G06F 17/12 (2006.01)
G06F 17/11 (2006.01)

(52) U.S. Cl.
CPC .......... *G01R 21/133* (2013.01); *G06F 17/11* (2013.01); *G06F 17/12* (2013.01)

(58) Field of Classification Search
USPC .......................................................... 702/60
See application file for complete search history.

(56) References Cited

U.S. PATENT DOCUMENTS 3,886,330 A  5/1975 Egelston et al.
3,903,399 A  9/1975 Enns et al.
(Continued)

FOREIGN PATENT DOCUMENTS

WO  2004040509  5/2004
WO  2010115452  10/2010
WO  2013173879  11/2013

OTHER PUBLICATIONS

L. Trajkovic, "Exploration of the theory of DC Operating Points for Analog Circuit Design,"CASEO Workshop, IEEE International Symposium on Circuits and Systems (ISCAS), Beijing, China, May 23, 2013, pp. 1-30.

*Primary Examiner* — Paul D Lee
(74) *Attorney, Agent, or Firm* — Gibb & Riley, LLC; Jeffrey C. Maynard, Esq.

(57) ABSTRACT

A system and method for analyzing steady-state powerflow in DC electrical networks in the presence of constant power loads and other nonlinear devices whose I-V characteristics can be modeled using algebraic functions. The networks include high power utility-size grids and microgrids, as well as vehicular, aircraft, and spacecraft power management and distribution systems. The method draws on the mathematical framework of the Holomorphic Embedded Loadflow Method (HELM), which has previously been applied in utility AC networks. The adaptation to DC systems depends on the choice of a proper embedding and a corresponding reflection condition on the embedded voltages. Additionally, the method is extended to nonlinear devices other than constant-power loads, such as photovoltaic panel sources, which are of interest for the power systems aboard spacecraft and other electric vehicles.

18 Claims, 4 Drawing Sheets

(56) References Cited

U.S. PATENT DOCUMENTS

| | | |
|---|---|---|
| 4,868,410 A | 9/1989 | Nakamura |
| 5,181,179 A | 1/1993 | Fang et al. |
| 5,418,708 A | 5/1995 | Nairus |
| 6,625,520 B1 | 9/2003 | Chen et al. |
| 6,775,597 B1 | 8/2004 | Ristanovic et al. |
| 7,007,253 B2 | 2/2006 | Gullapalli et al. |
| 7,177,727 B2 | 2/2007 | Chu et al. |
| 7,519,506 B2 | 4/2009 | Trias |
| 7,769,497 B2 | 8/2010 | Patel |
| 7,788,051 B2 | 8/2010 | Patel |
| 7,979,239 B2 | 7/2011 | Trias |
| 8,185,853 B2 | 5/2012 | Kim et al. |
| 8,315,742 B2 | 11/2012 | Patel |
| 8,543,360 B2 | 9/2013 | Nakhla et al. |
| 8,553,437 B2 | 10/2013 | Berggren et al. |
| 8,798,981 B2 | 8/2014 | Ito et al. |
| 8,847,430 B2 | 9/2014 | Juhlin |
| 8,849,614 B2 | 9/2014 | Trias |
| 8,912,682 B2 | 12/2014 | Rozman et al. |
| 2004/0158417 A1 * | 8/2004 | Bonet ................. H02J 3/00 702/57 |
| 2014/0265599 A1 | 9/2014 | Feng et al. |

\* cited by examiner

SYSTEM AND METHOD FOR OBTAINING THE POWERFLOW IN DC GRIDS WITH CONSTANT POWER LOADS AND DEVICES WITH ALGEBRAIC NONLINEARITIES

CROSS REFERENCE TO RELATED APPLICATIONS

The present application claims the benefit of U.S. Patent Application Ser. No. 62/187,839 entitled "SYSTEM AND METHOD FOR OBTAINING THE POWERFLOW IN DC GRIDS WITH CONSTANT POWER LOADS AND DEVICES WITH ALGEBRAIC NONLINEARITIES", filed on Jul. 2, 2015, the entire teachings of which are incorporated herein by reference.

GOVERNMENT LICENSE RIGHTS

This invention was made with government support under contract no. NNX17CC42P awarded by the National Aeronautics and Space Administration. The government has certain rights in the invention.

BACKGROUND

The systems and methods herein disclosed pertain to the general problem of calculating the steady-state powerflow of DC electrical power networks. In the context of power electronics and vehicular DC power systems, this is also referred to as calculating the operating point of the system. More specifically, the methods described here address the computation of the powerflow in the presence of constant power loads, which is a basic problem in power transmission and distribution systems, as well as in the nonlinear analysis of DC circuits.

The powerflow problem, also known as loadflow, is the cornerstone calculation for the analysis of electrical power systems. It essentially consists in the calculation of voltages at all buses, given a set of prescribed constant-power injections (load or generation), and one or more swing buses which act as the voltage reference and provide 'slack' power. Powerflow studies are widely used for utility AC grids, but the problem is less commonly known as such in DC systems. Part of the reason is that utility-size meshed DC systems are still at their early stage of development. Another reason is that practitioners of DC power electronics do not refer to this problem by the same name, but instead just use the generic term of "nonlinear analysis" of the steady state (also operating point, bias point). Nevertheless, the underlying problem in DC is completely analogous to its counterpart in AC. In this regard, a clarification is in order: the problem known as "DC Loadflow" actually has very little to do with the DC powerflow discussed here. The "DC Loadflow" is a linearized approximation to the AC powerflow, a technique that is commonly used for a range of studies in AC utility grids, mostly for expansion planning and market-related studies.

In the context of onboard DC power distribution systems in spacecraft and the so-called more-electric aircraft, ships, and vehicles, the power network is commonly referred to as the Power Management and Distribution (PMAD) system. In modern PMAD systems, constant-power loads play a major role. These are mainly DC motors, as well as other tightly regulated loads. Constant-power loads also play important roles in smaller DC power electronic systems, such as computers. In all these cases, the powerflow analysis is performed in the framework of the standard nonlinear analysis for finding the DC operating point (or points) of the circuit. Classical tools such as the well-known program SPICE used for analog electrics design contain algorithms for this calculation.

Just like their counterparts in AC systems, the state of the art powerflow algorithms for DC systems have all one thing in common, which is their reliance on numerical iteration as the root-finding technique lying at the core of the procedure. Examples of these core techniques are Gauss-Seidel iteration and the widely used Newton-Raphson method, in its many variants. Some powerflow algorithms improve on the performance and convergence properties of the core iterative methods by using homotopy (continuation methods). Other algorithms utilize alternative techniques such as evolutionary algorithms or interval arithmetic, with the aim of improving the chance of global convergence (i.e. increasing the chance of converging to a solution regardless of the initial guess point), but they also make use of Newton-Raphson to zero-in on the solutions. A recent overview of the state of the art in this domain is provided in L. Trajkovic, "Exploration of the theory of DC Operating Points for Analog Circuit Design," CASEO Workshop, IEEE International Symposium on Circuits and Systems (ISCAS), Beijing, China, 2013.

By contrast, U.S. Pat. Nos. 7,519,506 and 7,979,239 to A. Trias introduced a new AC powerflow method that is constructive and does not rely on contractive fixed-point iteration. The method, named the Holomorphic Embedding Loadflow Method (HELM), is based on a complex-valued embedding technique specifically tailored to exploit the particular algebraic nonlinearities of the powerflow problem (in contrast with numerical iteration, which is a generic root-finding technique that applies to any type of nonlinearity). It is important to remark that even though homotopy methods also use the concept of embedding, they have nothing in common with this new method. HELM uses techniques from complex analysis and algebraic geometry, and in particular draws heavily from the theory of complex algebraic curves. Its main advantages are that it unequivocally arrives to the operational solution if it exists, and conversely it unequivocally signals unfeasibility when the operational solution does not exist. The operational solution is the main solution of interest in power transmission and delivery systems; it is characterized by having high voltages (and low shunt currents) at buses everywhere, while all the other possible solutions have lower voltages (and higher shunt currents) at one or more buses. More precisely, HELM defines the operational solution as the one that continuously connects, in the analytic continuation sense, to a reference state at $s=0$ where all buses are energized, interconnected by the transmission network, but all connections to ground are open-circuited. The present disclosure extends the HELM method to DC systems, including not only constant power loads but also certain types of nonlinear devices.

SUMMARY

The method disclosed herein comprises a procedure for reliably calculating the steady-state powerflow of a DC power network consisting essentially of linear devices, constant power loads, and other nonlinear devices whose I-V characteristics can be described or approximated by algebraic functions. The present disclosure is framed under the general field of powerflow studies (also known as load-flow studies) of power systems, and also under the nonlinear analysis of the steady operating point of DC power circuits. It is mainly inspired by the Holomorphic Embedding Loadflow Method (HELM), first described in U.S. Pat. Nos. 7,519,506 and 7,979,239 to A. Trias.

Constant power loads introduce nonlinearity in the circuit equations, which raises serious challenges for traditional nonlinear DC analysis based on Newton-Raphson and similar iterative numerical methods. The system has, in general, a huge number of different solutions, of the order of $2^N$, where N is the number of constant power load buses in the network. A numerical iterative method may either diverge or converge onto any of these, with no predictability, due to the fractal structure of the initial point dependency problem. Homotopy-based methods improve the convergence rate because they follow a given solution more closely, but they cannot completely avoid the fractal nature of the border between the solutions' basins of attraction, and therefore are not 100% reliable either. The innovation disclosed here addresses these problems. It is based on the key insight that this DC problem has a mathematical structure in the algebraic realm that is similar to the corresponding AC power-flow problem, provided that one deals with the differences between real variables and complex phasors adequately.

The system and method herein disclosed addresses DC electrical power systems consisting essentially of linear elements (e.g., resistors, reactances, capacitors), constant power loads, and electronic devices exhibiting nonlinearity of algebraic type (i.e., non-transcendental functions). Power sources are herein modeled as idealized constant-voltage generators, thus acting in a similar fashion as swing buses in AC power networks. The networks considered here are relevant to power distribution systems such as those found on aircraft and spacecraft (PMAD, Power Management and Distribution System), and also to the next-generation meshed HVDC systems that power utilities are planning for the near future.

The powerflow equations of these systems are formally similar to the ones used in utility AC grids, except that they contain real variables instead of complex phasors. In order to apply the general theory of the Holomorphic Embedded powerflow method, it is key that the system is embedded in such a way that it reduces to an algebraic curve. The invention disclosed here shows how to embed the real system using a complex parameter s, together with the appropriate and corresponding reflection condition on the embedded voltages, so that the reduction to an algebraic curve is guaranteed. Once this is achieved, the mathematical theory of the Holomorphic Embedded Loadflow Method (HELM) applies, provided one makes suitable changes because the DC system is described by real variables. For instance, non-physical solutions are those for which one or more voltages turn out to be complex, and physical ones are those for which all voltages are real. For the actual numerical computation, the method focuses on the operational solution (as the powerflow problem is in general multi-valued, one needs to select the appropriate solution; in a power transmission and distribution context, there is only one operational solution, as defined in the Background section above). Then the HELM-based power series technique can be applied, which constructively computes the germ of the operational solution. Analytic continuation by means of Padé approximants then guarantees (by Stahl's theorem) that this solution branch is calculated in its maximal domain of analyticity. The end result is an unequivocal answer: it yields the operational solution if it exists, and conversely, it signals unfeasibility when it does not exist.

Additionally the disclosed method is also shown to contemplate the higher-order nonlinearities that are characteristic of devices commonly encountered in spacecraft, aircraft, and other more-electric vehicles. The only requirement is that the nonlinear I-V characteristic of such devices is described by an algebraic function (i.e., functions that do not involve transcendentals). In practice this requirement is easily fulfilled, as most I-V curves can be successfully approximated by polynomials of a sufficiently high degree. An embodiment is provided where a photovoltaic panel source is included as an example of this.

In cases where the characteristic behavior of loads or any other nonlinear device shows different regimes delimited by sharp changes, it is disclosed how to apply the method by piece-wise application of the base technique to each of the different regimes, and by simple combinatorial search in the space of possible regimes. An embodiment is provided where the method contemplates a load interfaced through a DC-DC converter with two very different regimes, which is a system commonly found in some PMAD systems aboard spacecraft.

DETAILED DESCRIPTION

The method disclosed herein contemplates any general type of fully DC power network consisting essentially of linear devices, constant-power loads, and other devices having nonlinearities of the algebraic type. Consider the power flow equations that describe the steady-state of such system, written in terms of the current balance at each bus:

$$\text{Bus } i: \sum_{j \neq i} G_{ij}^{(tr)}(V_j - V_i) = \sum_{j \neq i} I_{ij}^{(tr)}(V_j, V_i) + G_i^{(sh)} V_i + I_i^{(sh)}(V_i) + \frac{P_i}{V_i} \quad (1)$$

Figure 1:
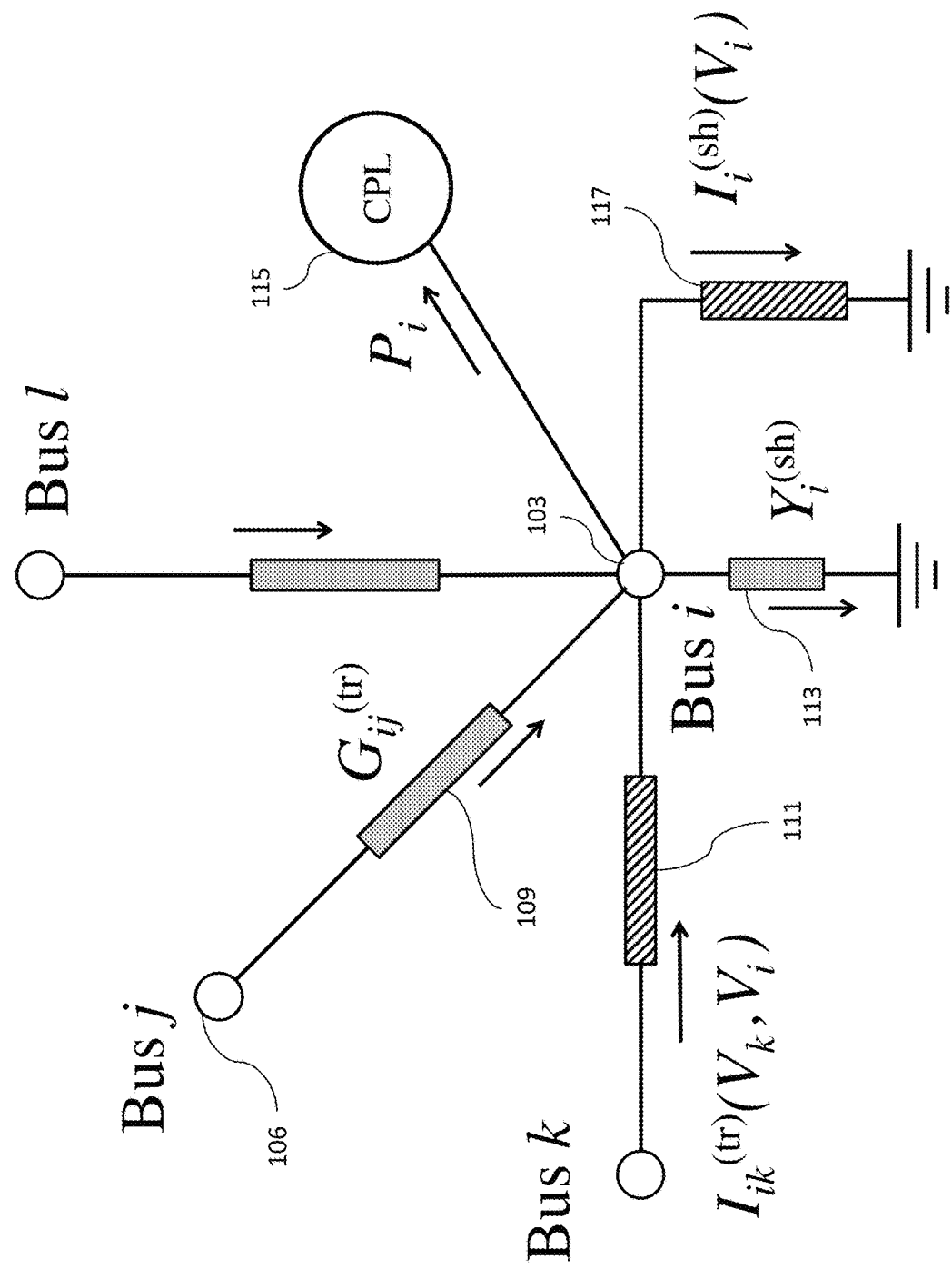
FIG. 1 is a schematic representation of a general DC power grid, displaying the sign conventions for voltage and power flow magnitudes as they are used in the description of the systems and methods herein.

The nomenclature and sign conventions used in the description of the systems and methods disclosed herein are depicted in FIG. 1. This schematic drawing illustrates a generic DC power network by showing all the possible devices attached to an arbitrary bus labeled i 103. Equation (1) holds for the voltage $V_i$ at each non-swing bus i 103. The summation runs over all buses, including the swing buses. At least one swing bus is assumed. The left hand side of equation (1) represents the net current entering the bus, while the right hand side represents the net current leaving the bus. The summation on the left hand side runs over adjacent neighbor buses j 106 linked by transmission lines 109 having conductances $G_{ij}^{(tr)}$. The summation on the right hand side runs over the series-connected nonlinear devices, which are assumed to have an I-V characteristic given by the algebraic function $I_{ij}^{(tr)}(V_j, V_i)$ 111. The shunt term $G_i^{(sh)}$ 113 is meant to include both line shunt resistive effects and any other resistive load attached to the bus. Each bus i 103 may also have shunt-connected nonlinear devices having an I-V characteristic given by the algebraic function $I_i^{(sh)}(V)$ 117, and/or constant power loads $P_i$ 115. Constant power sources (i.e. generation) are less common in DC systems, but they are also contemplated just by considering negative values of $P_i$. It is important to remark that all magnitudes involved in the DC powerflow problem are real, not complex. Equation (1) may have solutions in which one or more voltages are complex, but such solutions are non-physical.

In the following, a first embodiment of the method is disclosed for this general case. In order to apply the theory behind the Holomorphic Embedding method, it is not sufficient to look for any embedding that yields an easy to compute reference state at s=0. It is key to also preserve the algebraic nature of the original equations. To be precise, the embedding should be performed in such a way that the voltages become not just any function of the embedding parameter s, but algebraic curves in s. Moreover it is essential that this parameter is complex, not real, because it is only by working in the complex plane that the whole structure of solution branches can be explored (this is a consequence of fundamental theorem of algebra, which ensures that the algebraic curve, being a polynomial, always has n roots, n being the degree of the polynomial). Additionally, working in the complex plane will later on guarantee the application of Stahl's theorem, which is also essential for the convergence and maximality of the analytic continuation procedure that is used for the numerical evaluation of the power series.

The proposed embedding is then as follows:

$$\sum_{j \neq i} G_{ij}^{(tr)}(V_j - V_i) = \sum_{j \neq i} (1-s)(V_i - V_j)G_{ij}^{(nl)} + sI_{ij}^{(tr)}(V_j, V_i) + sG_i^{(sh)}V_i + sI_i^{(sh)}(V_i) + \frac{sP_i}{V_i} \quad (2)$$

where s is a complex parameter. Series-connected nonlinear devices are embedded in a way that their effect at s=0 is equivalent to a resistive transmission link with conductance $G_{ij}^{(n1)}$. This is done so that the analytic continuation of the reference state at s=0 (which represents an energized and connected power network with no loads) is connected with the operational solution at s=1, when all loads and devices are connected. The suggested value to use for $G_{ij}^{(n1)}$ is the corresponding ratio I(V)/V obtained at values near the expected operating voltage of the device. On the other hand, constant-power loads and shunt-connected devices are all embedded directly in s, so that they vanish at s=0. The aim is to obtain a reference state at s=0 that is equivalent to a linear, pure-transmission network that is energized by the swing bus, but having no connected loads.

As all nonlinear I-V functions are assumed algebraic, multiplying all equations by $V_i$ to eliminate denominators makes it explicit that equations (2) are polynomial, and therefore they define the voltages $V_i(s)$ as algebraic curves. Standard elimination procedures (such as, among others, Buchberger's algorithm for finding a Gröbner basis of the system) allow one to arrive to a single polynomial equation in one of the unknowns, while the rest are eliminated in a triangular fashion in terms of that one. Such explicit polynomial is expensive to compute in networks larger than just a few buses, but the important point here is that the embedded system (2) is now ensured to be an algebraic curve.

The second important point is to find out what is the equivalent counterpart of the reflection condition $\hat{V}_i(s)=V_i^*(s^*)$ that is needed in the AC HELM case. There, the system of equations has to be doubled, using a new set of variables $\hat{V}_i$ that are formally different from the original ones. Solutions in the AC case have to be checked for the reflection condition, thus providing the criteria for physical vs. non-physical ("ghost") solutions: those satisfying $\hat{V}_i(s)=V_i^*(s^*)$ are physically possible, while those that do not are ghost. In the DC case, things are different. Since the original powerflow equations (1) do not contain any complex conjugate operator, it is not necessary to duplicate the system to introduce any additional variables. What is actually needed in this case is to ensure that the voltages are real when the embedding parameter is real. Therefore, given a solution to the embedded system (2), the condition for it to be a physical solution is:

$$V_i(s)=V_i^*(s^*) \quad (3)$$

which will be referred to as the reflection condition for the embedded DC system. Solutions to equations (2) satisfying this condition are physically feasible, while solutions that do not are "ghost". Note however that nothing is said about the dynamical stability of physical solutions, since this is a steady-state powerflow analysis.

Next, the power series technique is used to numerically compute solutions. Although the method can be extended to calculate any of the multiple (physical) solution branches of this system, this disclosure focuses on calculating the main solution of interest in power transmission and delivery systems, which will be referred to as the operational solution: the unique solution is normally characterized by having high voltages (and low shunt currents) at buses everywhere, while all the other solutions have lower voltages (and higher shunt currents) at one or more buses. More precisely, the method defines the operational solution as the one that continuously connects, in the analytic continuation sense, to a reference state at s=0 where all buses are energized, interconnected by the transmission network, but all connections to ground are open-circuited. This unique reference solution is therefore $V_i(0)=V^{(swing)}$ everywhere.

Since the embedded system defines holomorphic functions $V_i(s)$, consider then their power series developed about s=0:

$$V_i(s) = \sum_{n=0}^{\infty} V_i[n]s^n \quad (4)$$

where $V_i[n]$ denotes the n-th coefficient of the series. Since all functions in equation (3) are assumed algebraic in their voltage arguments, they are also holomorphic in s, and therefore then can be developed in power series as well:

$$I_{ij}^{(tr)}(V_j(s), V_i(s)) = \sum_{n=0}^{\infty} I_{ij}^{(tr)}[n]s^n \quad (5)$$

$$I_i^{(sh)}(V_i(s)) = \sum_{n=0}^{\infty} I_i^{(sh)}[n]s^n$$

$$\frac{1}{V_i(s)} = \sum_{n=0}^{\infty} V_i^{-1}[n]s^n$$

It is rather straightforward to obtain the coefficients of these power series in terms of the coefficients of the voltage power series, $V_i[n]$. For instance, the coefficients of the inverse voltage function can be obtained from the relation:

$$V_i(s)\frac{1}{V_i(s)} = \sum_{n=0}^{\infty} V_i[n]s^n \sum_{n=0}^{\infty} V_i^{-1}[n]s^n = \sum_{n=0}^{\infty}\left(\sum_{k=0}^{n} V_i[k]V_i^{-1}[n-k]\right)s^n \quad (6)$$

The coefficients of the nonlinear I-V functions can be obtained similarly. Since they are assumed algebraic, it will always be possible to obtain them. For instance, if the function I(V) is assumed to be a low-order polynomial in V, its coefficients are simple convolutions of the coefficients of V. For a second-order polynomial $I=a_0+a_1V+a_2V^2$, one would obtain.

$$I(V) = a_0 + a_1 \sum_{n=0}^{\infty} V[n]s^n + a_2 \sum_{n=0}^{\infty}\left(\sum_{k=0}^{n} V[k]V[n-k]\right)s^n \quad (7)$$

For the general case involving an arbitrary algebraic function I(V), similar relations can be found by any person having ordinary skill in the art. Some specific techniques may be used in the case of polynomials having a very high order, in order to avoid too many convolutions and thus improve computational performance. One of such improvements is used in the second embodiment given further below.

Substituting the expressions for the power series in equations (4) and (5) into the main equation (2), and extracting the coefficients at an arbitrary order in s, say N+1, the method arrives at the following linear system:

$$\sum_{j\neq i}(G_{ij}^{(tr)} + G_{ij}^{(nl)})(V_j[N+1] - V_i[N+1]) = \sum_{j\neq i} G_{ij}^{(nl)}(V_j[N] - V_i[N]) + \quad (8)$$
$$\sum_{j\neq i} I_{ij}^{(tr)}[N] + G_i^{(sh)}V_i[N] + I_i^{(sh)}[N] + P_iV_i^{-1}[N]$$

The left hand side of this system contains the unknowns, the coefficients of the power series of the voltages at order N+1. Everything else on the right hand side is composed of coefficients at order N or lower. By bootstrapping these linear systems with an adequate power series germ at order zero, the sequential solution in sequence of these equations ensures the construction of the power series up to any desired order. It is important to remark that the matrix in these linear systems (i.e., $G_{ij}^{(tr)}+G_{ij}^{(n1)}$) remains fixed; therefore, the factorization only needs to be performed once.

It is of key importance at this step to make the adequate choice of solution at s=0 with which to bootstrap the calculations provided by equation (8). In fact, the embedding has been devised so that the system at s=0 has a unique solution that makes physical sense, namely an energized but unloaded transmission network (while all other physical powerflow solutions at this limit consist of one or more buses short-circuited to ground). For this particular powerflow solution, it is straightforward to verify from equation (8) at order zero that the linear system has a unique solution, consisting of all voltages being equal to the swing source, i.e. $V_i[0]=V^{(swing)}$ for all buses. The method then proceeds to calculate progressively the coefficients of the power series $V_i[n]$, by successive solution of equation (8) at each order, with the ensuing calculation of the coefficients appearing on the right hand side for the benefit of the calculation at the next order.

The method then concludes with the numerical evaluation of the solution at the desired point (s=1) by means of analytic continuation techniques. In particular, the method prescribes Padé approximants as the technique of choice, because in this case Stahl's theorem proves that the sequences of near-diagonal Padé approximants converge (in the capacity sense) to the actual function in its maximal domain of analytic continuation. Therefore if the operational solution exists, it is found because the Padé approximants converge; and conversely, if there is no feasible operational solution, then the Padé approximants do not converge.

Figure 2:
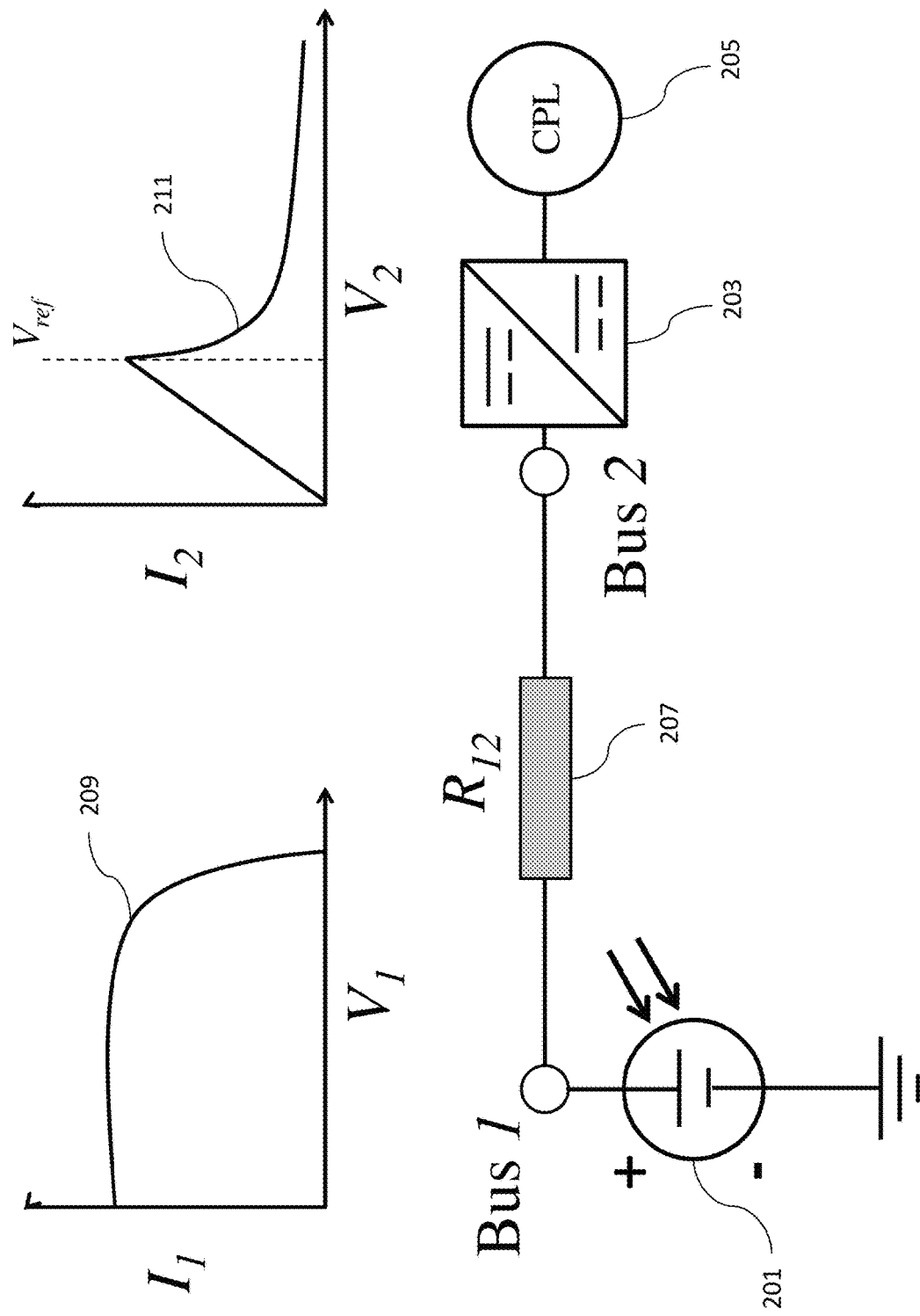
FIG. 2 is a schematic representation of the DC system used in the second exemplary embodiment used in the detailed description of the disclosure.

In another embodiment of the method, it is shown here how to optimize the treatment of functions with very high powers of V, which is a case appearing often when approximating the exponential behavior of some nonlinear devices. This second embodiment also shows how to treat cases where the characteristic I-V function has different regions of behavior separated by sharp changes (i.e. non-smooth functions). Let us consider a simplified model consisting of one solar photovoltaic (PV) array source coupled to a DC-DC buck converter feeding a load that is tightly regulated to have a constant-power characteristic. Some authors have proposed this system as a simplified model of the relevant behavior of DC power distribution systems onboard spacecraft. FIG. 2 displays a schematic view of this system. The solar PV array 201 has a characteristic I-V curve 209 with very high order nonlinearity in its output voltage $V_1$. Its output is fed to a DC-DC buck or buck converter 203, which is coupled to the regulated resistive load 207. The effective I-V characteristic 211 of the converter plus regulated load system 205 shows two very different regimes, one being linear resistive and the other one constant-power, depending on the value of its input voltage $V_2$.

The characteristic I-V curve of the solar PV panel array is assumed to be of the form:

$$I(V) = I_{max}\left(1 - \left(\frac{V}{V_{max}}\right)^K\right) \quad (9)$$

Some authors use K=33 as a good approximation, as it yields a maximum error of about 2% compared to the actual curve. Here $I_{max}$ is the short-circuit current of the PV array and $V_{max}$ is the open-circuit voltage. On the other hand, the system comprising the DC-DC buck converter coupled to the regulated load offers the following characteristic response:

$$\text{Desirable regime: } I(V) = \frac{V_{ref}^2}{R_L V} \text{ (if } V > V_{ref}^2\text{)} \quad (10)$$
$$\text{Undesirable regime: } I(V) = \frac{V}{R_L} \text{ (if } V \leq V_{ref}^2\text{)}$$

This I-V characteristic is continuous, but its first derivative is discontinuous (at $V=V_{ref}$). As such, this is not an algebraic function and therefore it cannot be directly accommodated in the Holomorphic Embedding method disclosed here. However, it is piecewise algebraic: it clearly shows two differentiated regimes. The way to deal with these situations varies a lot depending on the particular details of the I-V characteristic. Some cases may allow a suitable smoothing of the I-V function. In the general case, and particularly in small networks with few buses, the computational performance offered by the holomorphic method is sufficient to warrant a simple piecewise approach, i.e. the solution of the system by exploring all possible regimes in a combinatorial fashion and post-checking the results for consistency.

To illustrate this last point, the system under consideration would yield two different problems, each solvable by the holomorphic embedding procedure. The first one, for the undesirable regime of the converter coupled to the load:

$$I_{max}\left(1 - \left(\frac{V_1}{V_{max}}\right)^K\right) = \frac{V_1 - V_2}{R_{12}} \quad (11)$$

$$\frac{V_1 - V_2}{R_{12}} = \frac{V_2}{R_L} \text{ (if } V_2 \leq V_{ref}^2\text{)}$$

The second one, for the desirable regime:

$$I_{max}\left(1 - \left(\frac{V_1}{V_{max}}\right)^K\right) = \frac{V_1 - V_2}{R_{12}} \quad (12)$$

$$\frac{V_1 - V_2}{R_{12}} = \frac{V_{ref}^2}{R_L V_2} \text{ (if } V_2 > V_{ref}^2\text{)}$$

Both of these would be solved with the holomorphic embedded method and, at the end of the procedure, a check would be performed on the values of the obtained voltage $V_2$ to verify if the solution is consistent with the assumed regime in each case (note that, additionally for this model, voltage $V_1$ has to be lower than $V_{max}$ for the PV array, otherwise the solution is non-physical).

A more non-obvious aspect is how to deal efficiently with high-power nonlinearities, such as the exponent K=33 in device models such as equation (9), within the general holomorphic embedding scheme. This is disclosed in the following, using the desirable regime of equations (12) as an exemplary embodiment of this particular aspect of the invention. For the purpose of greater clarity, the system will be approximated by making the resistance of the transmission line $R_{12}=0$, which is a reasonable assumption in real systems, and moreover it does not essentially limit the following exposition. Then $V_1=V_2=V$ and the system thus reduces to a single equation:

$$I_{max}\left(1 - \left(\frac{V}{V_{max}}\right)^K\right) = \frac{V_{ref}^2}{R_L V} \quad (13)$$

The notation is highly simplified if the following dimensionless parameters are defined:

$$U \equiv \frac{V}{V_{ref}}; \ U_{max} \equiv \frac{V_{max}}{V_{ref}}; \ q \equiv \frac{V_{ref}}{I_{max} R_L} \quad (14)$$

Equation (3) then becomes:

$$1 - \left(\frac{U}{U_{max}}\right)^K = \frac{q}{U} \quad (15)$$

The corresponding embedded equation is:

$$1 - \left(\frac{U(s)}{U_{max}}\right)^K = \frac{sq}{U(s)} \quad (16)$$

Using the power series expansion of U(s) about s=0, plus the corresponding one for the function 1/U(s), and substituting them into equation (16) one would obtain, after extracting the terms at a given order N on both sides of the equation, a recurrence relationship for the coefficients of U(s). However, to avoid lengthy convolution expressions, let us first define the auxiliary function:

$$R(s) \equiv \left(\frac{U(s)}{U_{max}}\right)^K \quad (17)$$

Taking the logarithmic derivative of both sides of this expression, one obtains:

$$U(s)R'(s) = KR(s)U'(s) \quad (18)$$

Using the power series expansion of both U(s) and R(s), and substituting them into this equation, one obtains the following relation for the coefficients at order N:

$$\sum_{k=0}^{N}(k+1)R[k+1]U[N-k] = K\sum_{k=0}^{N}(k+1)U[k+1]R[N-k] \quad (19)$$

It is convenient to single out the highest order terms in this relation:

$$R[N+1]U[0] + \sum_{k=0}^{N-1}\left(\frac{k+1}{N+1}\right)R[k+1]U[N-k] = \quad (20)$$

$$KU[N+1]R[0] + K\sum_{k=0}^{N-1}\left(\frac{k+1}{N+1}\right)U[k+1]R[N-k]$$

The term R[N+1] can be obtained from the embedded powerflow equation (16):

$$R[N+1] = -qU^{-1}[N] \quad (21)$$

Since for the operational solution we should have a non-vanishing solution at s=0, from equation (16) one also obtains the starting values needed to bootstrap the recurrence relation shown in equation (20):

$$U[0] = U_{max}; \ R[0] = 1 \quad (22)$$

This finally yields:

$$U[N+1] = -\frac{qU_{max}}{K}U^{-1}[N] + \quad (23)$$

$$\frac{1}{K}\sum_{k=0}^{N-1}\left(\frac{k+1}{N+1}\right)R[k+1]U[N-k] - \sum_{k=0}^{N-1}\left(\frac{k+1}{N+1}\right)U[k+1]R[N-k]$$

where all the terms on the right hand side are known at order N. Therefore, this provides a method to progressively calculate all terms of the power series of U(s) (and those of the power series of the auxiliary functions R(s) and $U^{-1}(s)$), up to any desired order. The rest of the method consists in performing the analytic continuation of the power series of the voltages using Padé approximants, as discussed in the previous exemplary embodiment.

Figure 3:
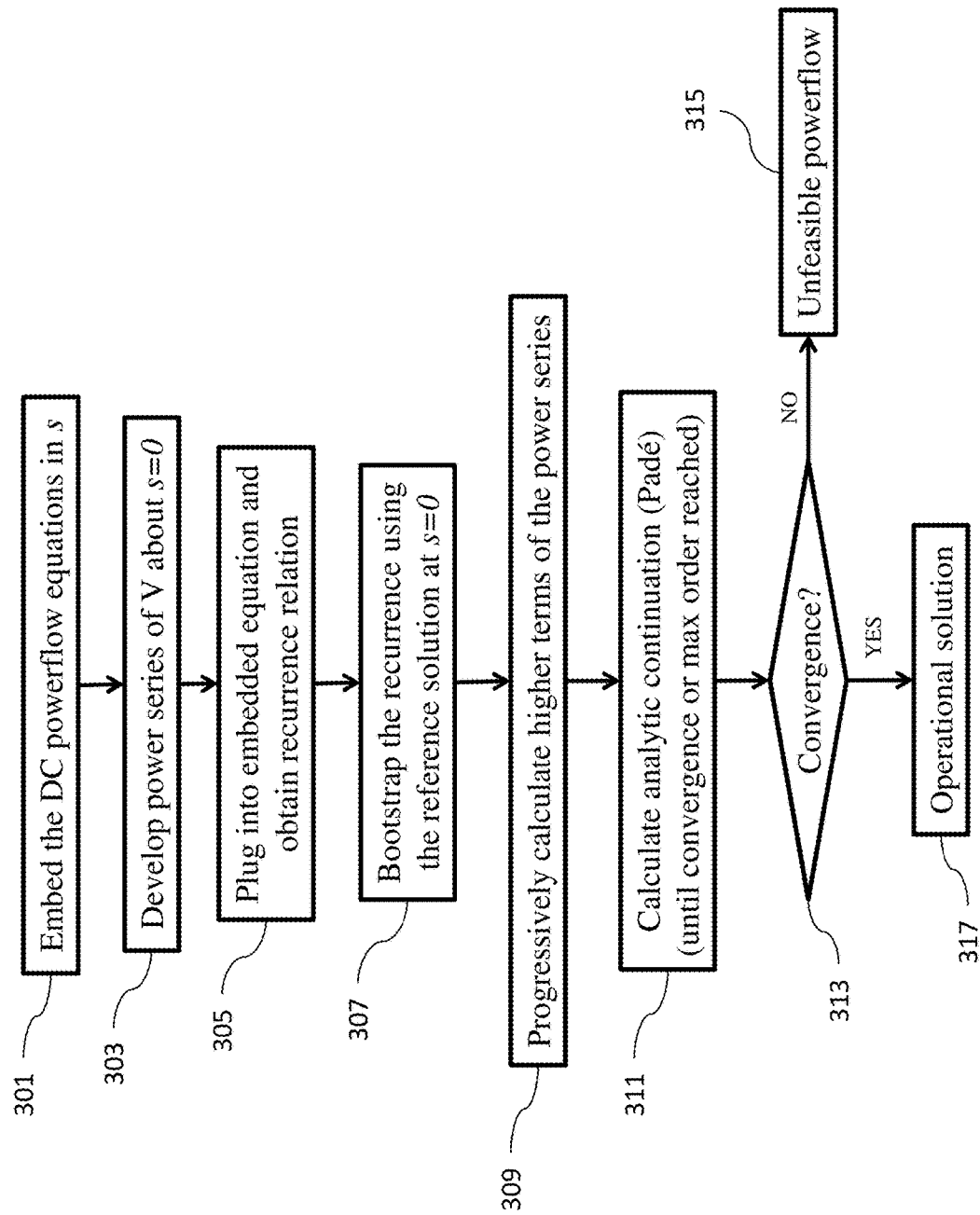
FIG. 3 is a flow-chart diagram illustrating systems and methods herein.

FIG. 3 depicts a flow chart summarizing the steps of the procedure disclosed herein. The first step, at 301, consists in embedding the DC powerflow equations in a complex embedding parameter s, in such a way that the system at s=0 becomes a pure transmission network without nonlinearities, and therefore has a clearly identifiable solution that will act as a reference. Next, the holomorphic voltages $V_i(s)$ are developed in power series about s=0, at 303. Substituting these into the embedded equation, and possibly optimizing the expressions for the power series coefficients of nonlinear functions of $V_i(s)$, one obtains a recurrence relationship, at 305, that allows obtaining the coefficients at order N+1 from the coefficients at order N and preceding ones. The procedure continues by progressively computing successive terms of the power series of V(s), at 309, and using these for calculating the analytical continuation of the series at s=1, using near-diagonal Padé approximants, at 311, until either the sequence of approximants converge, or a prescribed maximum order of the power series is reached. If, at 313, convergence is reached before such maximum threshold is met, then the obtained result is the operational solution, as indicated at 317. Otherwise, the powerflow problem is unfeasible, as indicated at 315. In case of nonlinear devices having different smooth regimes of operation, the whole procedure is repeated for each possible combination of regimes, and each solution needs to be post-checked for consistency with the assumed regime in each case.

Figure 4:
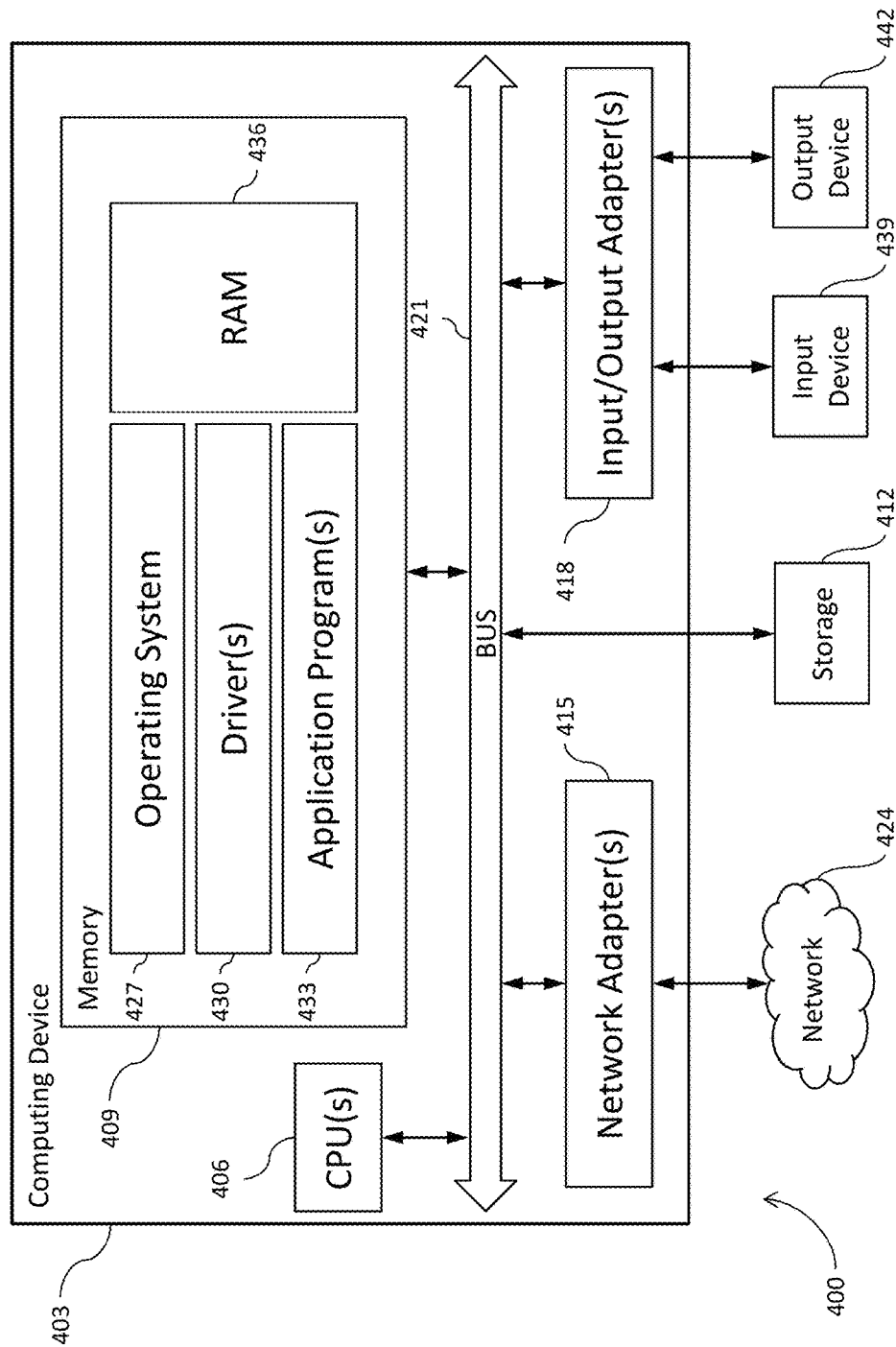
FIG. 4 is a schematic diagram of a hardware system according to systems and methods herein.

A representative hardware environment for practicing the systems and methods described herein is depicted in FIG. 4. This schematic drawing illustrates a hardware configuration of an information handling/computing system 400 in accordance with systems and methods herein. The computing system 400 comprises a computing device 403 having at least one processor or central processing unit (CPU) 406, internal memory 409, storage 412, one or more network adapters 415, and one or more input/output adapters 418. A system bus 421 connects the CPU 406 to various devices such as the internal memory 409, which may comprise random access memory (RAM) and/or read-only memory (ROM), the storage 412, which may comprise magnetic disk drives, optical disk drives, a tape drive, etc., the one or more network adapters 415, and the one or more input/output adapters 418. Various structures and/or buffers (not shown) may reside in the internal memory 409 or may be located in a storage unit separate from the internal memory 409.

The one or more network adapters 415 may include a network interface card such as a LAN card, a modem, or the like to connect the system bus 421 to a network 424, such as the Internet. The network 424 may comprise a data processing network. The one or more network adapters 415 perform communication processing via the network 424.

The internal memory 409 stores an appropriate Operating System 427, and may include one or more drivers 430 (e.g., storage drivers or network drivers). The internal memory 409 may also store one or more application programs 433 and include a section of Random Access Memory (RAM) 436. The Operating System 427 controls transmitting and retrieving packets from remote computing devices (e.g., host computers, storage systems, Supervisory Control and Data Acquisition systems—SCADA, etc.) over the network 424. In some systems and methods, the SCADA and/or Energy Management Systems (EMS) may connect to the computing system 400 over the network 424. The drivers 430 execute in the internal memory 409 and may include specific commands for the network adapter 415 to communicate over the network 424. Each network adapter 415 or driver 430 may implement logic to process packets, such as a transport protocol layer to process the content of messages included in the packets that are wrapped in a transport layer, such as Transmission Control Protocol (TCP) and/or Internet Protocol (IP).

The storage 412 may comprise an internal storage device or an attached or network accessible storage. Storage 412 may include disk units and tape drives, or other program storage devices that are readable by the system. A removable medium, such as a magnetic disk, an optical disk, a magneto-optical disk, a semiconductor memory, or the like, may be installed on the storage 412, as necessary, so that a computer program read therefrom may be installed into the internal memory 409, as necessary. Programs in the storage 412 may be loaded into the internal memory 409 and executed by the CPU 406. The Operating System 427 can read the instructions on the program storage devices and follow these instructions to execute the methodology herein.

The input/output adapter 418 can connect to peripheral devices, such as input device 439 to provide user input to the CPU 406. The input device 439 may include a keyboard, mouse, pen-stylus, microphone, touch sensitive display screen, or any other suitable user interface mechanism to gather user input. An output device 442 can also be connected to the input/output adapter 418, and is capable of rendering information transferred from the CPU 406, or other component. The output device 442 may include a display monitor (such as a Cathode Ray Tube (CRT), a Liquid Crystal Display (LCD), or the like), printer, speaker, etc.

The computing system 400 may comprise any suitable computing device 403, such as a mainframe, server, personal computer, workstation, laptop, handheld computer, telephony device, network appliance, virtualization device, storage controller, etc. Any suitable CPU 406 and Operating System 427 may be used. Application Programs 433 and data in the internal memory 409 may be swapped into storage 412 as part of memory management operations.

It is expected that any person skilled in the art can implement the disclosed procedure using a computer program. The computer program may include instructions that would be provided to a processor of a general purpose computer, special purpose computer, or other programmable data processing apparatus to produce a machine, such that the instructions that execute via the processor of the computer or other programmable data processing apparatus obtain powerflow solutions for a given DC power network model under various realizations of the load, generation, and other parameters. The generalization of the example charts shown above to any other DC power network model should be evident to any person skilled in the art.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart in FIG. 3 and block diagrams in FIG. 4 illustrate the architecture, functionality, and operation of possible implementations of systems, methods, and computer program products according to various systems and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the FIG. 3. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular systems and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and/or "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The concepts herein have been described with references to specific systems and methods. While particular values, relationships, materials and steps have been set forth for purposes of describing such concepts, it will be appreciated by persons skilled in the art that numerous variations and/or modifications may be made to the systems and methods as shown in the disclosure without departing from the spirit or scope of the basic concepts and operating principles as broadly described. It should be recognized that, in the light of the above teachings, those skilled in the art could modify those specifics without departing from the concepts taught herein. Having now fully set forth certain systems and methods, and modifications of the concepts underlying them, various other systems and methods, as well as potential variations and modifications of the systems and methods shown and described herein, will obviously occur to those skilled in the art upon becoming familiar with such underlying concept. It is intended to include all such modifications and alternatives insofar as they come within the scope of the appended claims or equivalents thereof. It should be understood, therefore, that the concepts disclosed might be practiced otherwise than as specifically set forth herein. Consequently, the present systems and methods are to be considered in all respects as illustrative and not restrictive.

What is claimed is:

1. A computer implemented method to solve powerflow problems of a DC electrical grid, the method comprising:
   receiving data from a power management and distribution system representative of conditions of a DC electrical grid;
   forming DC powerflow equations from said data;
   embedding said DC powerflow equations in a holomorphic embedding using a complex embedding parameter s, where s is a variable in a complex domain that includes a value s=0 that represents an energized and connected DC power network with no loads, and the value s=1 that represents the DC power network with all loads and devices connected, said embedding producing an embedded powerflow equation, wherein each variable of the embedded powerflow equation is contained as a function of the variable s by said holomorphic embedding;
   transcribing the holomorphic embedding into software for use in a computer processor adapted to execute said software;
   developing, in power series, voltages for the embedded powerflow equation about s=0, using said computer processor;

substituting said voltages into said embedded powerflow equation, using said computer processor, and obtaining a recurrence relationship that obtains coefficients of said power series at order N+1 from the coefficients at order N and preceding orders;

said computer processor progressively computing successive terms of the power series;

said computer processor using the successive terms of the power series to calculate the analytical continuation of the power series at s=1;

said computer processor identifying voltages for steady state operation of said DC electrical grid according to said powerflow equations by using said holomorphic embedding;

establishing said voltages for said steady state operation of said DC electrical grid; and operating said DC electrical grid using said established voltages.

2. The computer implemented method according to claim 1, wherein said DC powerflow equations model the DC electrical grid.

3. The computer implemented method according to claim 2, said DC electrical grid comprising nonlinear DC devices having nonlinearity being approximated by algebraic functions.

4. The computer implemented method according to claim 3, said nonlinear DC devices having regimes separated by abrupt changes.

5. The computer implemented method according to claim 1, wherein said data includes loads, generations, voltages, and flows.

6. The computer implemented method according to claim 1, further comprising:
said computer processor progressively computing successive terms of the power series to a desired accuracy.

7. The computer implemented method according to claim 6, said progressively computing successive terms of the power series to said desired accuracy further comprising using said computer processor to approximate a solution to said embedding using near-diagonal Padé approximants.

8. A computer implemented method to solve powerflow problems of a DC electrical grid, the method comprising:
receiving data from a power management and distribution system representative of conditions of a DC power generating system;

generating a mathematical model of powerflow equations for the DC power generating system in terms of nonlinear DC devices having nonlinearity being approximated by algebraic functions using said data;

embedding said mathematical model in a holomorphic embedding of said powerflow equations using a variable in a complex domain that includes a first value corresponding to a no load case representing an energized and connected DC power network with no loads and a second value corresponding to an objective case representative of said DC power network in a problem case, each variable of said powerflow equations being contained in said holomorphic embedding as a function of said variable;

transcribing said holomorphic embedding into software for use in a computer processor adapted to execute said software;

developing in power series, voltages for said powerflow equations using said holomorphic embedding, using said computer processor, said voltages being in a neighborhood of said first value for said no load case of said powerflow equations;

said computer processor substituting said voltages into said holomorphic embedding, and obtaining a recurrence relationship that obtains coefficients of said power series at order N+1 from the coefficients at order N and preceding orders;

said computer processor progressively computing successive terms of the power series, up to an order determined by desired accuracy;

said computer processor using the successive terms of the power series to calculate the analytical continuation of the power series at said objective case;

computing summation of said power series to said desired accuracy;

said computer processor identifying voltages for steady state operation of said DC electrical grid according to said powerflow equations by using said holomorphic embedding;

establishing said voltages for said steady state operation of said DC electrical grid; and operating said DC electrical grid using said established voltages.

9. The computer implemented method according to claim 8, said nonlinear DC devices having regimes separated by abrupt changes.

10. The computer implemented method according to claim 8, said computer processor progressively computing said summation of said power series to said desired accuracy further comprising using said computer processor to approximate a solution to said holomorphic embedding using near-diagonal Padé approximants.

11. The computer implemented method according to claim 8, further comprising:
continuously providing a measure of powerflow in said DC power generating system, based on said data from said power management and distribution system.

12. The computer implemented method according to claim 8, said data comprising loads, generations, voltages, and flows in said DC power generating system.

13. A system for measuring powerflow in a DC power generating system having a DC electrical grid with n nodes, said system comprising: a power management and distribution system adapted to collect data from said DC electrical grid, said data being indicative of electrical conditions in said DC electrical grid, and a microprocessor-controlled energy management system, said power management and distribution system being in communication with the microprocessor-controlled energy management system, said microprocessor-controlled energy management system further comprising a program of instructions executable by said energy management system to:
process said data received from said power management and distribution system into powerflow equations representing said DC electrical grid;

embed said powerflow equations representing the DC electrical grid in a holomorphic embedding using a variable in a complex domain that includes a first value corresponding to a no load case representing an energized and connected DC power network with no loads and a second value corresponding to an objective case representative of said DC electrical grid in a problem case, each variable of said powerflow equations being contained in said holomorphic embedding as a function of said variable;

develop in power series, voltages for said powerflow equations using said holomorphic embedding, said voltages being in a neighborhood of said first value for said no load case of said powerflow equations;

substitute said voltages into said holomorphic embedding, and obtaining a recurrence relationship that obtains coefficients of said power series at order N+1 from the coefficients at order N and preceding orders;

progressively compute successive terms of the power series up to an order determined by desired accuracy;

use the successive terms of the power series to calculate the analytical continuation of the power series at said objective case;

compute summation of said power series to said desired accuracy;

identifying voltages for steady state operation of said DC electrical grid according to said powerflow equations by using said holomorphic embedding;

establish said voltages for said steady state operation of said DC electrical grid; and operate said DC electrical grid using said established voltages.

14. The system according to claim 13, said microprocessor-controlled energy management system further comprising executable computer instructions to: display the solution to the load flow equations as a measure of a state of stability of the DC electrical grid.

15. The system according to claim 13, said microprocessor-controlled energy management system further comprising executable computer instructions to: approximate a solution to said holomorphic embedding using near-diagonal Padé approximants.

16. The system according to claim 13, said microprocessor-controlled energy management system further comprising executable computer instructions to: confirm that a set of voltages and flows contained in a physical solution to said load flow equations are representative of a physical electrical state of said DC electrical grid.

17. The system according to claim 13, said DC electrical grid comprising nonlinear DC devices having nonlinearity being approximated by algebraic functions.

18. The system according to claim 17, said nonlinear DC devices having regimes separated by abrupt changes.

* * * * *